United States Patent [19]
Katz

[11] Patent Number: 4,874,953
[45] Date of Patent: Oct. 17, 1989

[54] METHOD FOR GENERATION OF TUNABLE FAR INFRARED RADIATION FROM TWO-DIMENSIONAL PLASMONS

[75] Inventor: Joseph Katz, Pasadena, Calif.

[73] Assignee: California Institute of Technology, Pasadena, Calif.

[21] Appl. No.: 254,141

[22] Filed: Oct. 6, 1988

[51] Int. Cl.$^4$ ............................................... H01S 3/19
[52] U.S. Cl. .............................. 250/493.1; 250/495.1; 250/504 R; 372/4; 372/44; 372/20; 357/17; 357/23.1
[58] Field of Search ............... 250/493.1, 495.1, 494.1, 250/504 R, 251; 372/4, 43, 20, 44; 357/17, 23.1

[56] References Cited

U.S. PATENT DOCUMENTS

| | | | |
|---|---|---|---|
| 4,386,274 | 5/1983 | Altshuler | 250/251 |
| 4,571,727 | 2/1986 | Nishizawa et al. | 372/4 |
| 4,706,251 | 11/1987 | Rona | 372/4 |
| 4,754,141 | 6/1988 | Mindock | 250/493.1 |
| 4,820,929 | 4/1989 | Modisette et al. | 250/493.1 |

OTHER PUBLICATIONS

S. J. Allen et al., "Observation of the Two-Dimensional Plasmon in Silicon Inversion Layers," Phys. Rev. Lett., vol. 38, No. 17, pp. 980–983, 4/25/77.
T. N. Theis, "Plasmons in Inversion Layers," North-Holland Publishing Co. and Yamada Science Foundation, Surface Science 98, (1980), pp. 515–532.
D. C. Tsui, "Far Infrared Emission From Plasma Oscillations Of Si Inversion Layers," Solid St. Comm., vol. 35, pp. 875–877, 1980.
T. N. Theis et al., "Two-Dimensional Magnetoplasmon in the Silicon Inversion Layer," Solid St. Comm., vol. 24, pp. 273–277, 1977.
C. Grimes et al., Phys. Rev. Lett. 36, 145, (1976).
N. Okisu et al., Electron. Lett. 22, 877, (1986).

*Primary Examiner*—Carolyn E. Fields
*Assistant Examiner*—John A. Miller
*Attorney, Agent, or Firm*—Freilich, Hornbaker, Rosen & Fernandez

[57] ABSTRACT

Tunable far infrared radiation is produced from two-dimensional plasmons in a heterostructure, which provides large inversion-layer electron densities at the heterointerface, without the need for a metallic grating to couple out the radiation. Instead, a light interference pattern is produced on the planar surface of the heterostructure using two coherent laser beams of a wavelength selected to be strongly absorbed by the heterostructure in order to penetrate through the inversion layer. The wavelength of the far infrared radiation coupled out can then be readily tuned by varying the angle between the coherent beams, or varying the wavelength of the two interfering coherent beams, thus varying the periodicity of the photoconductivity grating to vary the wavelength of the far infrared radiation being coupled out.

10 Claims, 3 Drawing Sheets

METHOD FOR GENERATION OF TUNABLE FAR INFRARED RADIATION FROM TWO-DIMENSIONAL PLASMONS

ORIGIN OF THE INVENTION

The invention described herein was made in the performance of work under a NASA contract, and is subject to the provisions of Public Law 96-517 (35 USC 202) in which the Contractor has elected to retain title.

TECHNICAL FIELD

The invention relates to generation of far infrared (FIR) radiation from two-dimensional (2D) plasmons, and more particularly to a method and apparatus for optically tuning the FIR wavelength.

BACKGROUND ART

Plasmons in a two-dimensional system were first reported by C. C. Grimes and G. Adams, in Phys. Rev. Lett. 36, 145 (1976) on the surface of liquid helium, and later by S. J. Allen, Jr., D. C. Tsui, and R. A. Logan in Phys. Rev. Lett. 38, 980 (1977) in the inversion layer of electrons at the interface of a metal-oxide-semiconductor field-effect transistor (MOSFET) shown in FIG. 1, and more recently by N. Okisu and T. Kobayashi, in Electron. Lett. 22, 877 (1986) at the heterointerface of a AlGaAs/GaAs heterostructure. The plasmons are coupled to the radiation field by a conductive metal grating structure superimposed on a second semitransparent metal film, with the grating having a periodicity which is typically several micrometers as shown in a typical example illustrated in FIG. 1.

The grating appears as a short circuit for radiation polarized parallel to the plane of the grating, thereby reflecting nearly all of the radiation. For radiation perpendicular to the plane of the grating, there is modulation of the far-infrared field with the periodicity of the grating, resulting in the coupling of the plasma oscillations of the inversion layer electrons with wave vectors $q = n2\pi/\Lambda$, where $n = 1, 2 \ldots$, to the radiation field. By passing current, I, through the device, far infrared radiation is produced at the wave vector $q = 2\pi/\Lambda$. Coupling of the plasmons and the radiation field at the resonance peak take place at large inversion-layer electron densities. Consequently, tuning the infrared radiation is possible only by varying the periodicity of the grating, which is not possible in the prior art as that is fixed at the time of fabrication, and by varying the two-dimensional electron concentration, which requires deposition of a gate electrode below the grating. Due to pinch-off effects, this gate limits the power density level that can be generated to low levels ($\lesssim 10^{-7}$ W/cm$^2$).

STATEMENT OF THE INVENTION

In accordance with the present invention, tunable far-infrared radiation from two-dimensional plasmons is produced from a semiconductor device which provides large inversion-layer electron densities without the need for a metallic grating on a planar surface parallel to the inversion layer. Instead, two coherent beams are directed to the planar surface of the device at an angle to each other, and at a wavelength selected for the light to be strongly absorbed, generating a photoconductivity grating through the inversion layer. Maximum and minimum photogenerated carrier locations correspond to the respective maxima and minima of the interfering light beams. This photogenerated conductivity grating thus produced by the interfering beams couples the two-dimensional plasmons to the far infrared radiation beam. The wavelength of the far infrared radiation can then be readily tuned by varying the angle between the beams, or varying the wavelength of the two interfering coherent light beams.

The novel features that are considered characteristic of this invention are set forth with particularity in the appended claims. The invention will best be understood from the following description when read in connection with the accompanying drawings.

DETAILED DESCRIPTION OF THE INVENTION

Figure 1:
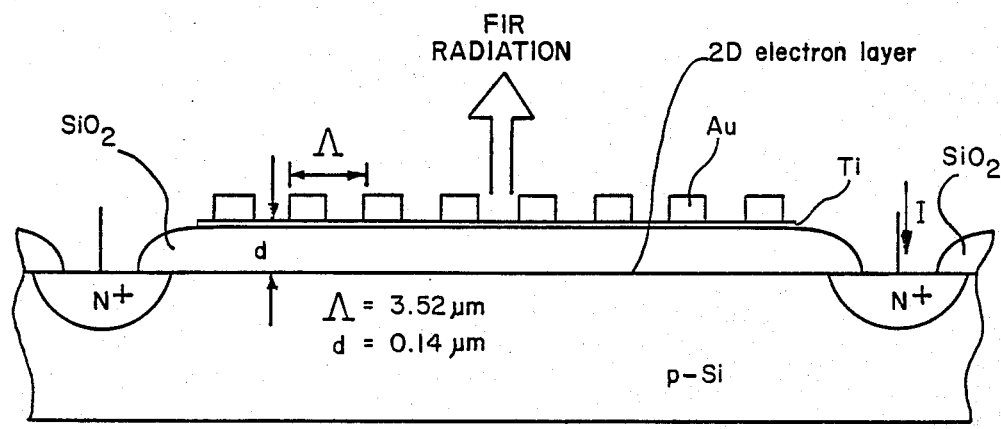
FIG. 1 illustrates schematically a prior-art device for infrared radiation from two-dimensional plasmons using a metal grating on a semitransparent metal film over p-doped silicon.
Figure 2:
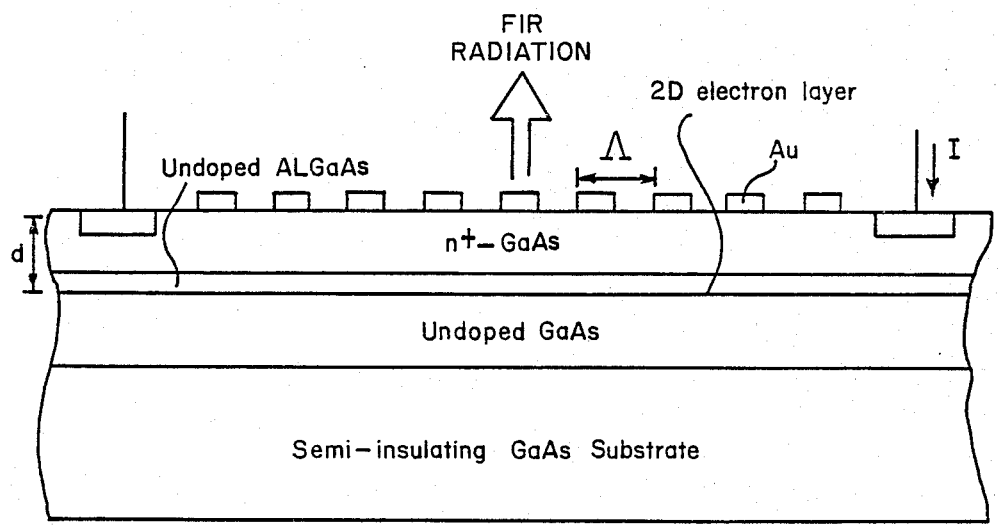
FIG. 2 illustrates a prior-art device for infrared radiation from two-dimensional plasmons using a metal grating over an AlGaAs heterostructure.
Figure 3:
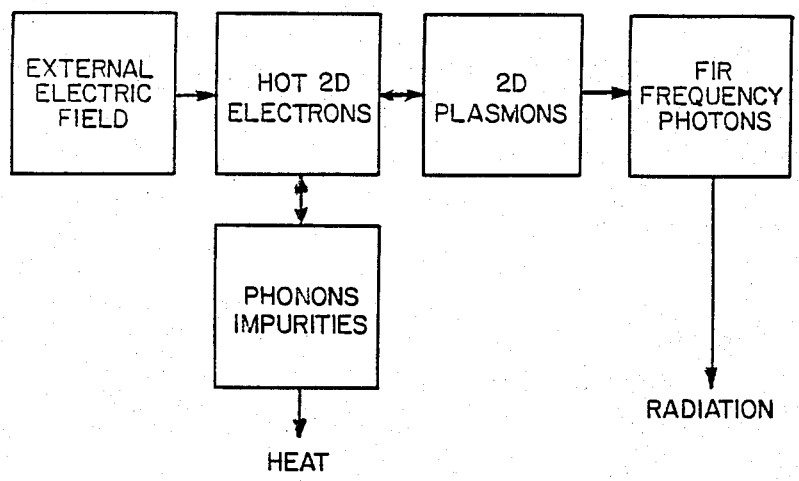
FIG. 3 is an energy flow diagram of the physical process in generating FIR radiation from 2D plasmons.

As noted above, two-dimensional (2D) plasmons have been utilized for generating far-infrared (FIR) radiation. Both silicon MOSFET-type inversion layers and AlGaAs heterostructure devices have been utilized as shown in FIGS. 1 and 2, respectively, to establish the necessary hot two-dimensional electron population. FIG. 3 illustrates the physical processes involved, starting with an electric field to generate the hot 2D electrons. Those electrons in turn produce the plasmons that are then coupled out as FIR radiation. Some energy is lost as heat from the hot 2D electrons. In the diagram, the arrows indicate the direction of energy flow, from which it should be appreciated that the physical process is reversible. Starting with input radiation, the output is then a detectable electric field output. In that case, the device becomes an infrared radiation detector, and in either case wavelength tunability would be desirable.

The dispersion relation of the 2D plasmon is:

$$f^2 = \frac{n_s q^2}{4\pi^2 m^*} \frac{k}{\epsilon_1 + \epsilon_2 g(kd)} \qquad (1)$$

where: k and f are the plasmon wave vector and frequency, respectively; q and m* are the electron charge and effective mass, respectively; $n_s$ is the electron surface density; and d is the distance between the 2D electrons and the metal grating structure that couples the plasmons to the FIR radiation; $g = \coth(kd)$ in silicon MOSFET type devices and $g = \tanh(kd)$ in AlGaAs heterostructures. $\epsilon_1$ and $\epsilon_2$ and the dielectric constants of the AlGaAs and vacuum (in AlGaAs heterostructure devices), and oxide and metal (in MOSFET devices). The grating periodicity $\Lambda$ determines the plasmon wave vector $$k = \frac{2\pi}{\Lambda} \quad (2)$$

and, thus, for a given device, the FIR frequency, f, is determined by the electron surface density, $n_s$. In silicon MOSFETS, a gate (thin film metallization) is required below the grating as shown in FIG. 1 in order to create the inversion layer (FET channel), which is where the 2D electron population is generated. By varying the gate voltage, the electron surface density $n_s$ is varied, and tunability is easily achieved. However, the phenomenon of channel pinch-off (common to all FET devices), limits the electric field that can be usefully applied between the drain and source, which limits the power density levels that can be generated by such devices to $\lesssim 10^{-7}$W/cm$^2$.

In an AlGaAs heterostructure-based device, as shown in FIG. 2, the 2D electrons can be generated at the heterointerface without the need for a metal gate and, thus, much higher power density levels ($\gtrsim 10^{-5}$W/cm$^2$) have been demonstrated, and even higher levels ($\sim 10^{-2}$W/cm$^2$) are expected. See Okisu cited above. However, elimination of the metal gate makes it impossible to modulate the electron surface density $n_s$ and, thus, to achieve wavelength tunability.

Figure 4:
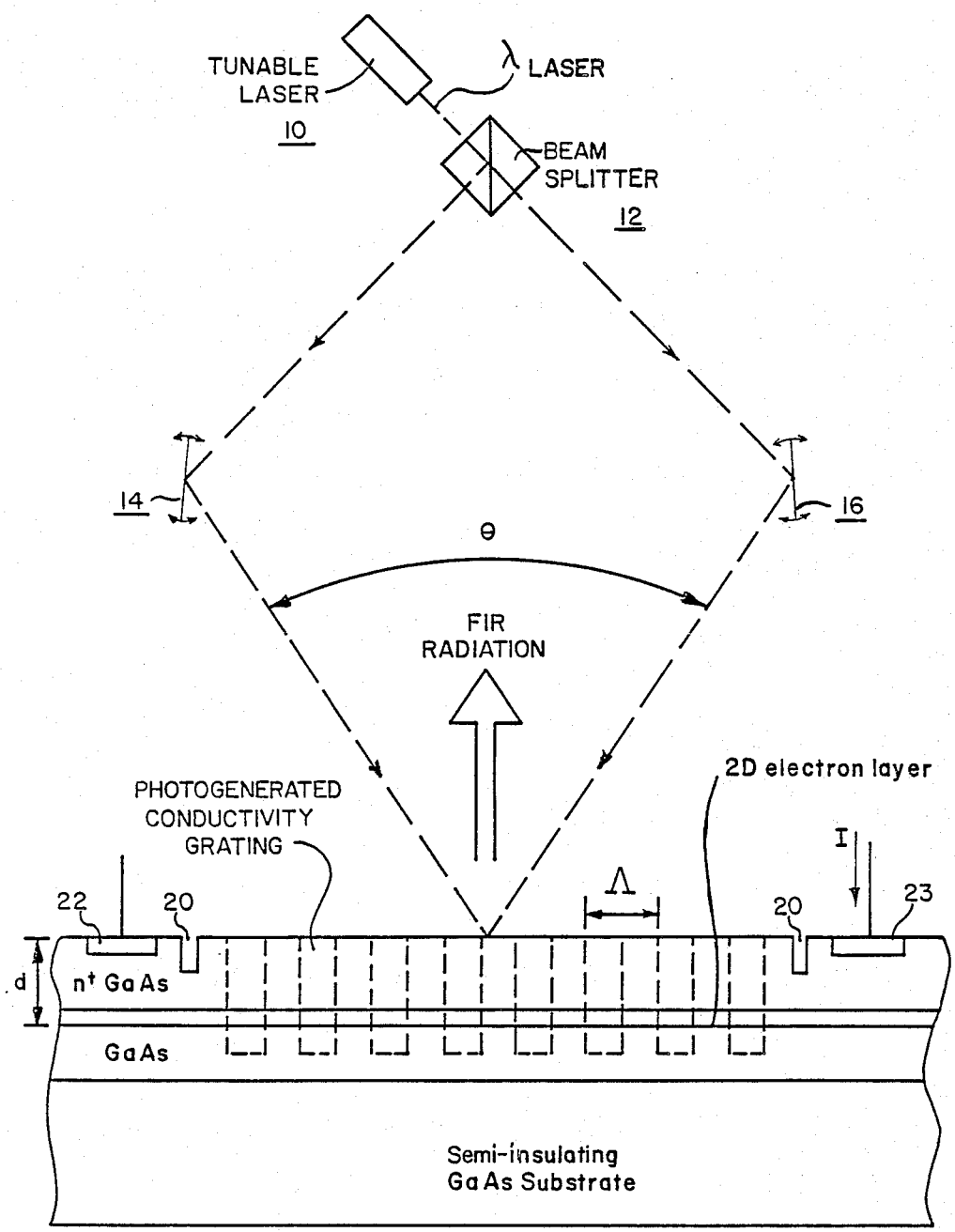
FIG. 4 illustrates an AlGaAs heterostructure for infrared radiation from two-dimensional plasmons without using a metal grating, and instead using a photoconductivity grating in accordance withe the present invention.

The present invention involves a modified AlGaAs heterostructure-based device as shown in FIG. 4. It does not have a metal grating on top. Instead, two tunable coherent laser beams derived from a laser 10 and beam splitter 12, and adjustable mirrors 14 and 16, interfere on top of the device. The wavelength $\lambda_{laser}$ of the interfering laser beams is sufficiently short so the laser light is strongly absorbed, generating electron-hole pairs. Maximum and minimum photogenerated carrier density locations correspond to maxima and minima, respectively, of the interfering light beams which produce a photogenerated conductivity grating between etched isolation channels 20 and 21 between the drain 22 and source 23. This photogenerated conductivity grating will couple the 2D plasmons to the FIR radiation. (Coupling requires conductivity modulation provided by the grating.) Since the photogenerated grating periodicity $\Lambda$ depends on the angle $\theta$ between the optical beams and the laser wavelength $\lambda_{laser}$, $$\Lambda = \frac{\lambda_{laser}}{2 \sin \frac{\theta}{2}}, \quad (3)$$

the plasmon wave vector Eq. (2) and, thus, the FIR frequency Eq. (1) can be tuned by varying the angle $\theta$ between the beams, or varying the wavelength $\lambda_{laser}$. Techniques for effecting each of the alternate variations for FIR tuning are well known.

PRACTICAL CONSIDERATIONS

Assuming that each period of the grating is composed of a region of width t with low-sheet conductance $Y_1$ and an adjacent region of width ($\Lambda$-t) with high-sheet conductance $Y_2$ (for gratings formed optically, t$\sim\Lambda$/2), the coupling efficiency of the grating is proportional to $$\frac{Y_2 - Y_1}{\frac{t}{\Lambda} Y_2 + \left(1 - \frac{t}{\Lambda}\right) Y_1}. \quad (4)$$

From Eq. (4) it is clear that to increase the coupling efficiency, it is necessary for $Y_2 > Y_1$.

Assuming the photogenerated conductivity grating is produced with a 10 mW He-Ne laser ($\lambda_{laser}$=6238 Å) capable of generating a peak power density of 200 mW/cm$^2$ (laser light) on a 2×2 mm$^2$ device (which will result in absorption of $\sim 6\cdot 10^{17}$ph/cm$^2$/sec), the absorption coefficient is 2·10$^4$cm$^{-1}$ at this wavelength, corresponding to an absorption length of 0.5 $\mu$m. Since the decay length of the FIR radiation in the semiconductor material is much larger than the absorption length of the light, the FIR field will interact with the entire photogenerated conductivity grating. Absorption of $\sim 6\cdot 10^{17}$ph/cm$^2$/sec over a length of 0.5 $\mu$m corresponds to a generation rate G of $\sim 1.2\cdot 10^{22}$ carriers/cm$^3$/sec. The carrier concentration N is $$N = G\tau \quad (5)$$

where $\tau$ is the carrier lifetime. For $\tau = 5\cdot 10^{-9}$sec, the carrier concentration N is 6·10$^{13}$cm$^{-3}$. This concentration is comparable to the background carrier concentration in the undoped AlGaAs region, so the coupling coefficient factor in Eq. (4) can be expected to exceed 0.1. Higher coupling coefficients can be achieved with higher power lasers.

Some degradation is expected due to diffusion and drift effects. If diffusion effects are taken into account, the grating concentration modulation, N, will be reduced from $N = G\tau$ Eq. (5) to:

$$N = \frac{G\tau}{1 + \left(\frac{2\pi L_D}{\Lambda}\right)^2} \quad (6)$$

where $L_D$ is the diffusion length of the carriers (typically 2 or 3 $\mu$m) and $\Lambda$ is the grating periodicity which is typically of the order of several micrometers for these devices. Another measure that may be taken to reduce diffusion effects is to reduce the carrier mobility constant (and hence the diffusion constant) by growing the top layer with aluminum concentration of x$\approx$0.43. Since the grating serves only to couple the plasmons out, and does not seem to play a major role in their actual excitation, such an aluminum concentration may be the optimum choice.

Heat dissipation from the light absorption is negligible. For a 100 $\mu$m thick GaAs substrate with a thermal conductivity of 0.5 W.cm-K (and even higher at reduced temperatures), absorption of 10 mW" will cause heating of only 2K.

Although particular embodiments of the invention have been described and illustrated herein, it is recognized that modifications and variations may readily occur to those skilled in the art, such as other hetero- or homostructures used with a photoconductive grating. Consequently, it is intended that the claims be interpreted to cover such modifications and variations.

I claim:

1. A method for generating far infrared radiation from two-dimensional plasmons in an inversion layer of electrons of a semiconductor device without a metallic grating comprising the steps of producing two coherent beams of radiation at the same wavelength selected for the radiation to be strongly absorbed by said semiconductor device, and directing said coherent beams onto a surface of said semiconductor device parallel to said inversion layer at an angle with respect to each other to produce an interference pattern that generates a photoconductivity grating penetrating through said inversion layer of electrons, thereby to couple out a beam of far infrared radiation through said surface.

2. A method for generation of far infrared radiation from two-dimensional plasmons as defined in claim 1, further including the step of tuning the wavelength of said far infrared radiation by varying said angle between said beams to vary the periodicity of said photoconductivity grating, thereby to vary the wavelength of said far infrared radiation.

3. A method for generation of far infrared radiation from two-dimensional plasmons as defined in claim 1, further including the step of tuning the wavelength of said far infrared radiation by varying the wavelength of said coherent beams to vary the periodicity of said photoconductivity grating, thereby to vary the wavelength of said far infrared radiation.

4. Apparatus for generating far-infrared radiation from two-dimensional plasmons in an inversion layer of electrons in a semiconductor device without a metallic grating comprising two coherent laser beams including means to direct said beams to a planar surface of said device at an angle to each other, said planar surfae being parallel to said inversion layer, said coherent laser beams being at a wavelength selected for the light to be strongly absorbed, and said angle being selected to produce a light interference pattern with a predetermined periodicity to produce a photoconductivity grating penetrating through said inversion layer to couple out far infrared radiation through said planar surface.

5. Apparatus as defined in claim 4 wherein means are provided to vary said angle so as to said periodicity of said interference pattern, to vary the periodicity of said photoconductivity grating in order to vary the wavelength of said far infrared radiation.

6. Apparatus as defined in claim 4 wherein means are provided to vary said wavelength of said coherent laser beams so as to vary the periodicity of said interference grating and thus vary the wavelength of said infrared radiation.

7. Apparatus for generating far infrared radiation from two-dimensional plasmons in an AlGaAs heterostructure, which provides an inversion layer of electrons at the heterointerface thereof, without the need for a metal grating on a surface parallel to said heterointerface, comprising two coherent laser beams including means to direct said laser beams to said surface of said heterostructure at an angle to each other, and at a wavelength selected for the laser light to be strongly absorbed by said heterostructure, so as to produce a photoconductivity grating which penetrates through said inversion layer to couple two-dimensional plasmons to the far infrared radiation through said surface.

8. Apparatus as defined in claim 7 wherein means are provided to vary said angle between said coherent laser beams for tuning the wavelength of said far infrared radiation coupled out of said heterostructure by said photoconductivity grating.

9. Apparatus as defined in claim 7 wherein means are provided to vary said wavelength of said two coherent laser beams for tuning the wavelength of said far infrared radiation coupled out of said heterostructrue by said photoconductivity grating.

10. Apparatus for generating tunable far infrared radiation from two-dimensional plasmons in a heterostructure which provides inversion-layer electron densities at the heterointerface thereof comprising means for producing a light interference pattern having a photoconductivity grating on the planar surface of said heterostructure using two coherent beams of a wavelength selected to be strongly absorbed in order to penetrate through said inversion layer and couple out far infrared radiation, and means for tuning the wavelength of far infrared radiation thus generated by varying the angle between the coherent beams, or varying the wavelength of the two interfering coherent beams, thus varying the periodicity of the photoconductivity grating to vary the wavelength of the far infrared radiation coupled out.

* * * * *